(12) United States Patent
Im

(10) Patent No.: US 12,550,501 B2
(45) Date of Patent: Feb. 10, 2026

(54) DISPLAY DEVICE

(71) Applicant: LG DISPLAY CO., LTD., Seoul (KR)

(72) Inventor: HeeJin Im, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 419 days.

(21) Appl. No.: 18/219,403

(22) Filed: Jul. 7, 2023

(65) Prior Publication Data
US 2024/0213423 A1    Jun. 27, 2024

(30) Foreign Application Priority Data
Dec. 27, 2022    (KR) .................... 10-2022-0185440

(51) Int. Cl.
*H10H 20/856*    (2025.01)
*H01L 25/075*    (2006.01)
*H10H 29/14*    (2025.01)

(52) U.S. Cl.
CPC ....... *H10H 20/856* (2025.01); *H01L 25/0753* (2013.01); *H10H 29/142* (2025.01)

(58) Field of Classification Search
CPC . H10H 20/856; H10H 29/142; H10L 25/0753
See application file for complete search history.

(56) References Cited

U.S. PATENT DOCUMENTS

2021/0151422 A1*    5/2021    Iguchi ................... H01L 25/167

OTHER PUBLICATIONS

Zhang et al., CN 109256455, Jun. 12, 2020 (Year: 2020).*
Ikeda et al., CN 115621398, Jan. 17, 2023 (Year: 2023).*

* cited by examiner

*Primary Examiner* — Mary Ellen Bowman
(74) *Attorney, Agent, or Firm* — PnK IP LLC

(57) ABSTRACT

A display device includes a substrate provided with a plurality of subpixels and configured to include a central area and a peripheral area surrounding the central area, a light emitting diode formed in each of the plurality of subpixels on the substrate, and an optical structure formed on the light emitting diode, wherein the plurality of subpixels includes a first subpixel formed in the central area and a second subpixel formed in the peripheral area, the optical structure disposed in the first subpixel is disposed in the center of the first subpixel, and the optical structure disposed in the second subpixel is disposed closer to the other side of the second subpixel than one side of the second subpixel.

15 Claims, 5 Drawing Sheets

DISPLAY DEVICE

CROSS-REFERENCE TO RELATED APPLICATION

This application claims the priority of Korean Patent Application No. 10-2022-0185440 filed on Dec. 27, 2022, which is hereby incorporated by reference in its entirety.

BACKGROUND

Filed of the Disclosure

The present disclosure relates to a display device, and more particularly, to a display device using a light emitting diode.

Description of the Background

A display device is widely used as a display screen of a laptop computer, a tablet computer, a smart phone, a portable display device, and a portable information device display device in addition to a display screen of a television or a monitor. A liquid crystal display device and an organic light emitting display device display an image by the use of thin film transistor serving as a switching element.

The liquid crystal display device displays an image by the use of light irradiated from a backlight unit disposed under a liquid crystal display panel because the liquid crystal display device is not in a self-luminous manner. Since the liquid crystal display device has the backlight unit, there is a limitation in design, and luminance and response speed may be reduced. Since the organic light emitting display device includes an organic material, the organic light emitting display device is vulnerable to moisture, whereby reliability and lifespan thereof may be deteriorated.

Recently, research and development of a light emitting diode display device using a micro light emitting diode has been conducted, and the light emitting diode display device has high quality and high reliability, whereby it is spotlighted as a next generation display device. Particularly, research is performed to further improve the light efficiency of the light emitting diode display device.

SUMMARY

The present disclosure to provide a display device with an improved light efficiency.

In accordance with an aspect of the present disclosure, the above and other features may be accomplished by the provision of a display device comprising a substrate provided with a plurality of subpixels and configured to include a central area and a peripheral area surrounding the central area, a light emitting diode formed in each of the plurality of subpixels on the substrate, and an optical structure formed on the light emitting diode, wherein the plurality of subpixels includes a first subpixel formed in the central area and a second subpixel formed in the peripheral area, the optical structure disposed in the first subpixel is disposed in the center of the first subpixel, and the optical structure disposed in the second subpixel is disposed closer to the other side of the second subpixel than one side of the second subpixel.

In addition to the effects of the present disclosure as mentioned above, additional advantages and features of the present disclosure will be clearly understood by those skilled in the art from the above description of the present disclosure.

BRIEF DESCRIPTION OF THE DRAWINGS

The above and other features and advantages of the present disclosure will be more clearly understood from the following detailed description taken in conjunction with the accompanying drawings, in which.

DETAILED DESCRIPTION

Figure 1:
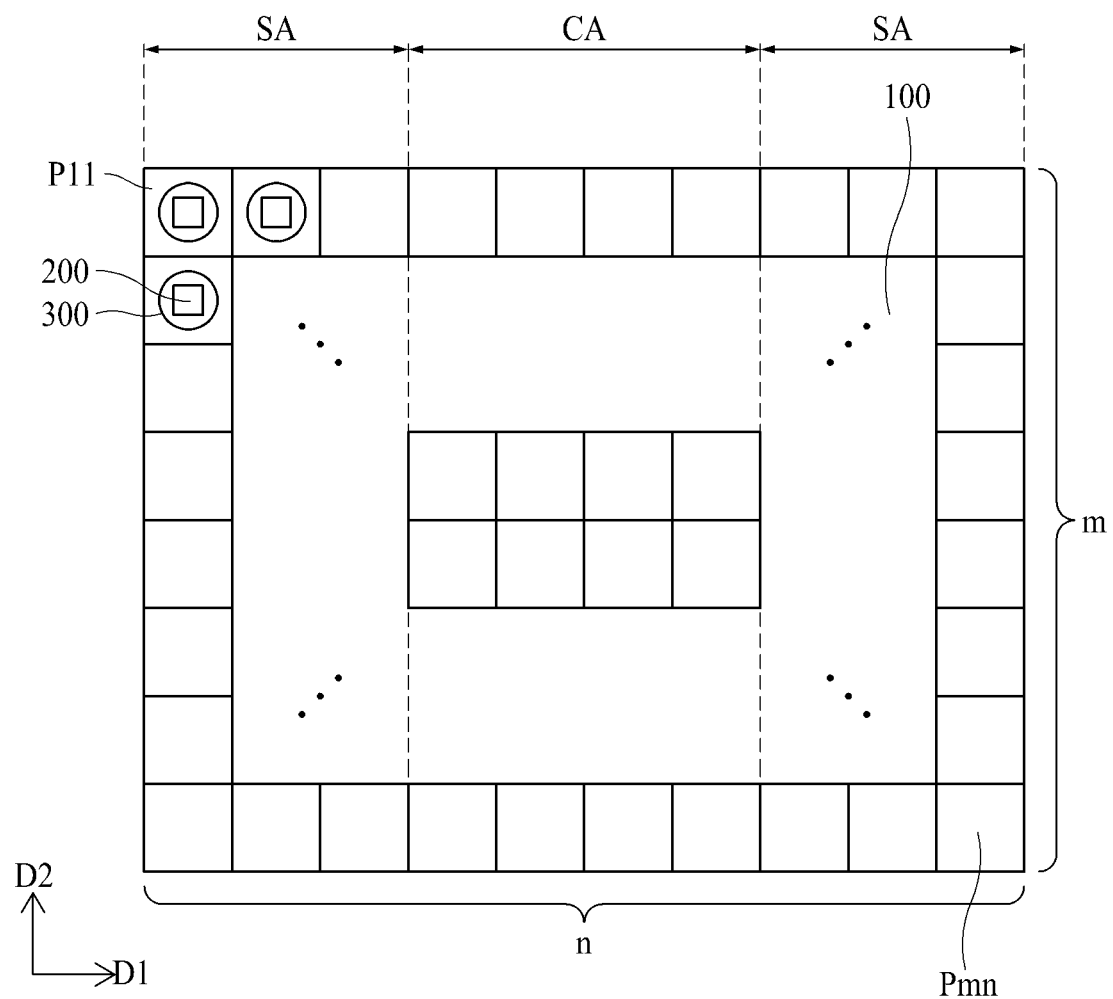
FIG. 1 is a plan view illustrating a display device according to one aspect of the present disclosure.

Advantages and features of the present disclosure, and implementation methods thereof will be clarified through the following aspects, described with reference to the accompanying drawings. The present disclosure may, however, be embodied in different forms and should not be construed as being limited to the aspects set forth herein. Rather, these aspects are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing aspects of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," "beneath", and "next," the case of no contact therebetween may be included, unless "just" or "direct" is used.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various aspects of the present disclosure may be partially or overall coupled to or combined with each other, and may be variously inter-operated with each other and driven technically as those skilled in the art may sufficiently understand. The aspects of the present disclosure may be carried out independently from each other, or may be carried out together in a co-dependent relationship.

Hereinafter, a display device according to the present disclosure will be described with reference to the accompanying drawings.

Figure 2:
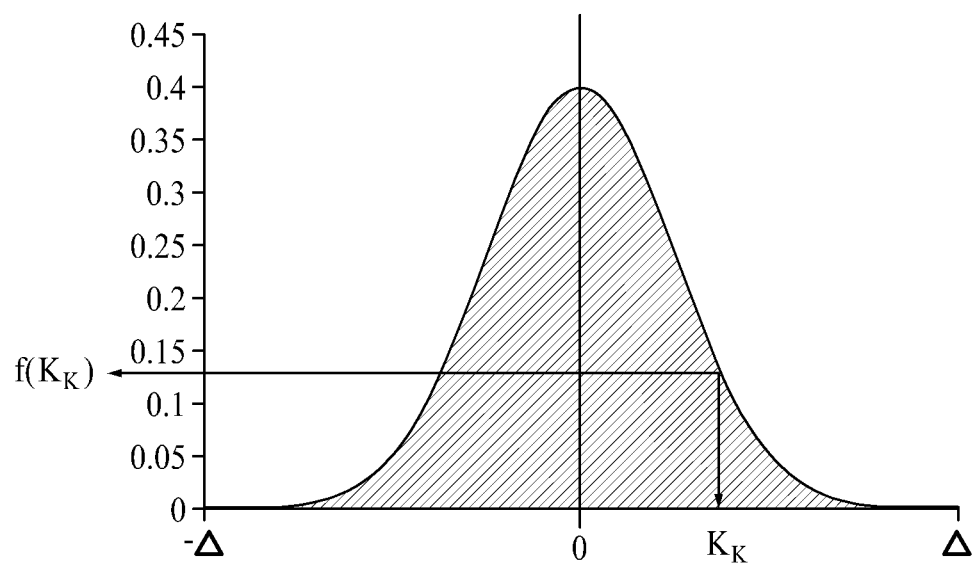
FIG. 2 is a graph illustrating one aspect of the present disclosure.

FIG. 1 is a plan view illustrating a display device according to one aspect of the present disclosure. FIG. 2 is a graph illustrating one aspect of the present disclosure.

Referring to FIG. 1, a display device according to one aspect of the present disclosure may include a substrate 100, a plurality of light emitting diodes 200, and a plurality of optical structures 300.

The substrate 100 may include a central area CA and a peripheral area SA surrounding the central area CA. A plurality of subpixels Pmn may be formed in the central area CA and the peripheral area SA. The plurality of subpixels Pmn may be arranged in a matrix form including 'm' rows and 'n' columns ('m' and 'n' are integers greater than 1).

Each of the plurality of subpixels Pmn may include the light emitting diode 200 and the optical structure 300. The light emitting diode 200 is formed on the substrate 100, and the light emitting diode 200 may emit light. In addition, the optical structure 300 is formed on the light emitting diode 200, and the optical structure 300 may improve a light extraction efficiency of the light emitting diode 200.

In general, when the light emitting diode 200 is formed in each of the plurality of subpixels Pmn, the light emitting diode 200 may be formed in the center of the subpixel Pmn to uniformly emit light in each subpixel Pmn. That is, the center of the light emitting diode 200 and the center of the subpixel Pmn may be formed at the same position. However, in the manufacturing process, some of the plurality of light emitting diodes 200 may not be formed at the center of the subpixel Pmn. Specifically, the plurality of light emitting diodes 200 may be formed on the substrate 100 through a process of transferring the plurality of light emitting diodes 200 onto the substrate 100 on which the subpixel Pmn is dividedly provided. However, since the size of the plurality of light emitting diodes 200 is very small compared to the subpixel Pmn, there may be an error in positioning the plurality of light emitting diode 200.

Particularly, as compared to the light emitting diode 200 formed in the subpixel of the central area CA, the light emitting diode 200 formed in the subpixel of the peripheral area SA has a high possibility that it is not positioned at the center of the subpixel Pmn. That is, an error may occur in the formation position of the light emitting diode 200 formed in the subpixel of the peripheral area SA. Accordingly, even if the optical structure 300 is disposed at the center of the subpixel Pmn, an error may occur in arrangement relation between the optical structure 300 and the light emitting diode 200. In this case, the light generated by the light emitting diode 200 may not pass through the optical structure 300 and may be directly emitted in an upper direction of the display device. Accordingly, effects of the optical structure 300 may be reduced. To overcome this problem, the present disclosure discloses that the formation position of the plurality of optical structures 300 is adjusted in consideration of the arrangement error of the light emitting diode 200.

For example, some of the plurality of light emitting diodes 200 may be formed at the position spaced apart from the center of the subpixel Pmn by deviation $\Delta$. That is, some of the plurality of light emitting diodes 200 may be spaced apart from the center of the subpixel Pmn by $\Delta X$ in the first direction D1, and may be formed at the position spaced apart by $\Delta Y$ in the second direction D2 perpendicular to the first direction D1. In this case, the value of $\Delta$ may follow a normal distribution shown in FIG. 2. The graph of FIG. 2 is a graph obtained by sampling a value which is equal to or more than $-\Delta$ and is also equal to or less than $\Delta$ to 'k' value. In addition, a regular distribution of $\Delta$ has an average value ($\mu$) and a standard deviation value ($\sigma$), and may follow a probability density function of Equation 1.

$$f(x \mid \mu, \sigma^2) = \frac{1}{\sigma\sqrt{2\pi}} \exp\left[-\frac{(x-\mu)^2}{2\mu^2}\right] \qquad \text{Equation 1}$$

At this time, the formation position of the optical structure 300 may be set through the regular distribution of FIG. 2 and the probability density function of Equation 1. A separation distance in the first direction D1 from the center of the subpixel Pmn to the center of the optical structure 300 may be 'dx' and a separation distance in the second direction D2 from the center of the subpixel Pmn to the center of the optical structure 300 may be 'dy'. Also, a range of values of 'dx' and 'dy' may follow a range of Equation 2.

$$-\Delta X < dx < \Delta X, \; -\Delta Y < dy < \Delta Y \qquad \text{Equation 2}$$

Referring to FIG. 2, the value of 'dx' or 'dy' may be divided into $k_1$ to $k_k$ when sampling the value which is equal to or more than $-\Delta$ and is also equal to or less than $\Delta$ to 'k' value. Also, when the subpixel Pmn is formed in the central area CA, the value of $k_k$ may be close to '0'. In addition, when the subpixel Pmn is formed in the peripheral area SA, the value of $k_k$ may be close to '$\Delta$'.

That is, according to the above Equations 1 and 2, the formation position of each of the plurality of optical structures 300 is adjusted in consideration of an error in the formation position of the light emitting diode 200. Accordingly, the arrangement error between the light emitting diode 200 and the optical structure 300 may be reduced even if the light emitting diode 200 is not formed in the center of the subpixel Pmn. That is, when the light emitting diode 200 is not formed in the center of the subpixel Pmn, the optical structure 300 may also be formed at the position adjacent to the center of the subpixel Pmn. Thus, it is possible to increase the possibility that the light generated by the light emitting diode 200 passes through the optical structure 300 and is emitted in the upper direction of the display device. That is, the effect and efficiency of the optical structure 300 may be improved.

In addition, the position in which each of the plurality of optical structures 300 is formed in the subpixel Pmn may be different. For example, at least one optical structure 300 is formed in the center of the subpixel Pmn, and at least another optical structure 300 may not be formed in the center of the subpixel Pmn. That is, at least one optical structure 300 may be formed closer to the other side of the subpixel Pmn than one side of the subpixel Pmn.

Figure 3A:
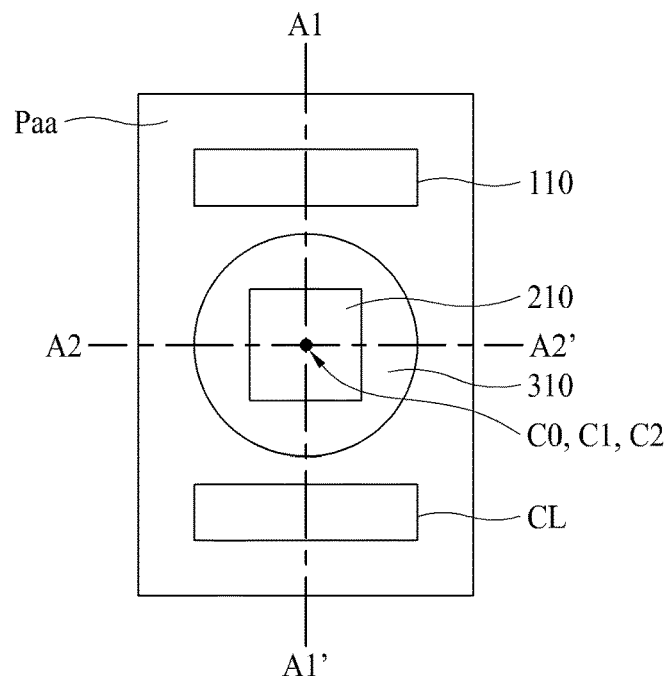
FIGS. 3A and 3B are plan views illustrating one subpixel of a display device according to one aspect of the present disclosure.
Figure 3B:
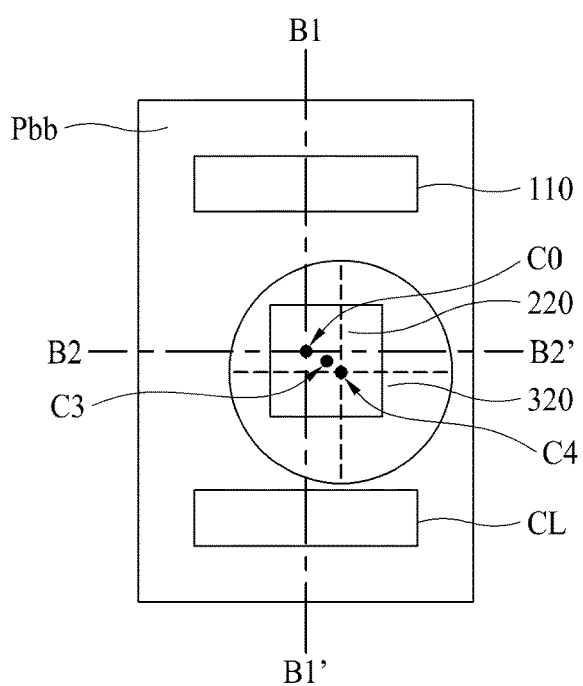

FIGS. 3A and 3B are plan views of one subpixel of the display device according to one aspect of the present disclosure.

Specifically, FIG. 3A shows a first subpixel Paa formed in the central area CA of the substrate 100. The first subpixel Paa may include a first light emitting diode 210 and a first optical structure 310. In this case, the first light emitting diode 210 may be formed at the position where the center C1 of the first light emitting diode 210 overlaps with the center C0 of the first subpixel Paa. In addition, the first optical structure 310 may be formed at the position where the center C2 of the first optical structure 310 overlaps with the center C0 of the first subpixel Paa. That is, the center C1 of the first light emitting diode 210 and the center C2 of the first optical structure 310 may overlap with each other. Also, the first light emitting diode 210 and the first optical structure 310 may be formed in the center of the first subpixel Paa.

Referring to FIG. 3B, FIG. 3B illustrates a second subpixel Pbb formed in the peripheral area SA of the substrate 100. The second subpixel Pbb may include a second light emitting diode 220 and a second optical structure 320. In this case, an error occurs in a transfer process of the second light emitting diode 220, whereby the second light emitting diode 220 may not be formed in the center of the second subpixel Pbb. That is, the second light emitting diode 220 may be formed at the position where the center C3 of the second light emitting diode 220 and the center C0 of the second subpixel Pbb do not overlap with each other. As described above with reference to FIG. 2, the second optical structure 320 may be formed at the position where the center C4 of the second optical structure 320 and the center C0 of the second subpixel Pbb do not overlap with each other. Also, FIG. 3B shows that the center C3 of the second light emitting diode 220 does not overlap with the center C4 of the second optical structure 320, but not limited thereto. For example, the center C3 of the second light emitting diode 220 overlaps with the center C4 of the second optical structure 320, and may not overlap with the center C0 of the second subpixel Pbb.

Figure 4A:
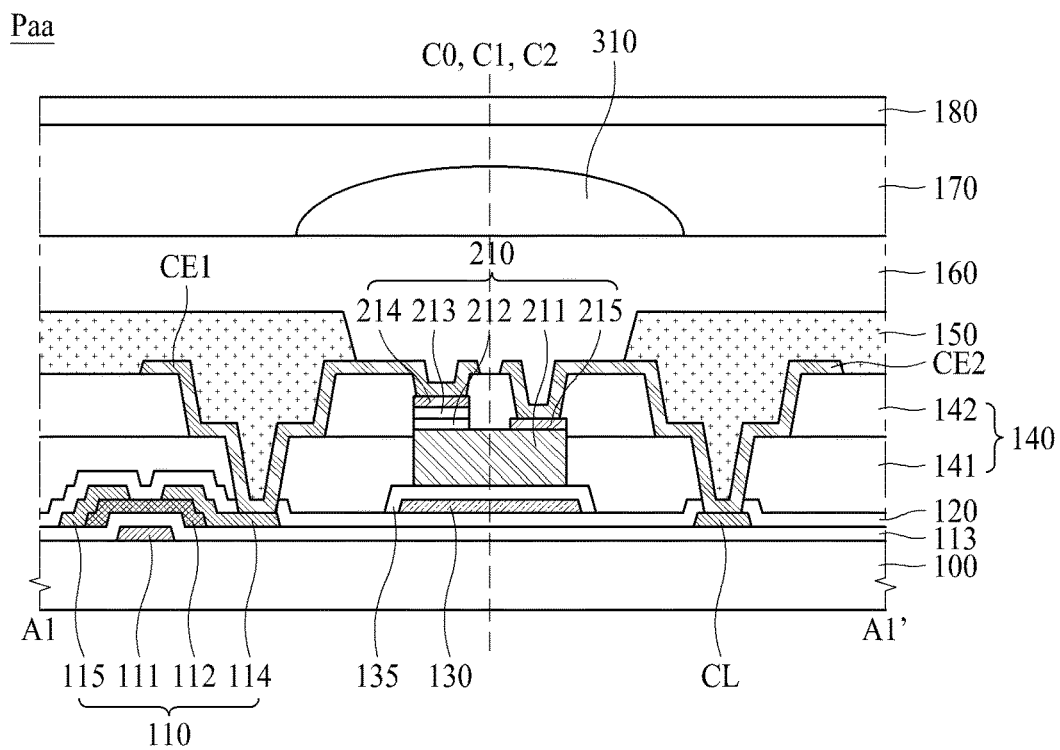
FIGS. 4A and 4B are cross-sectional views illustrating a display device according to one aspect of the present disclosure.
Figure 4B:
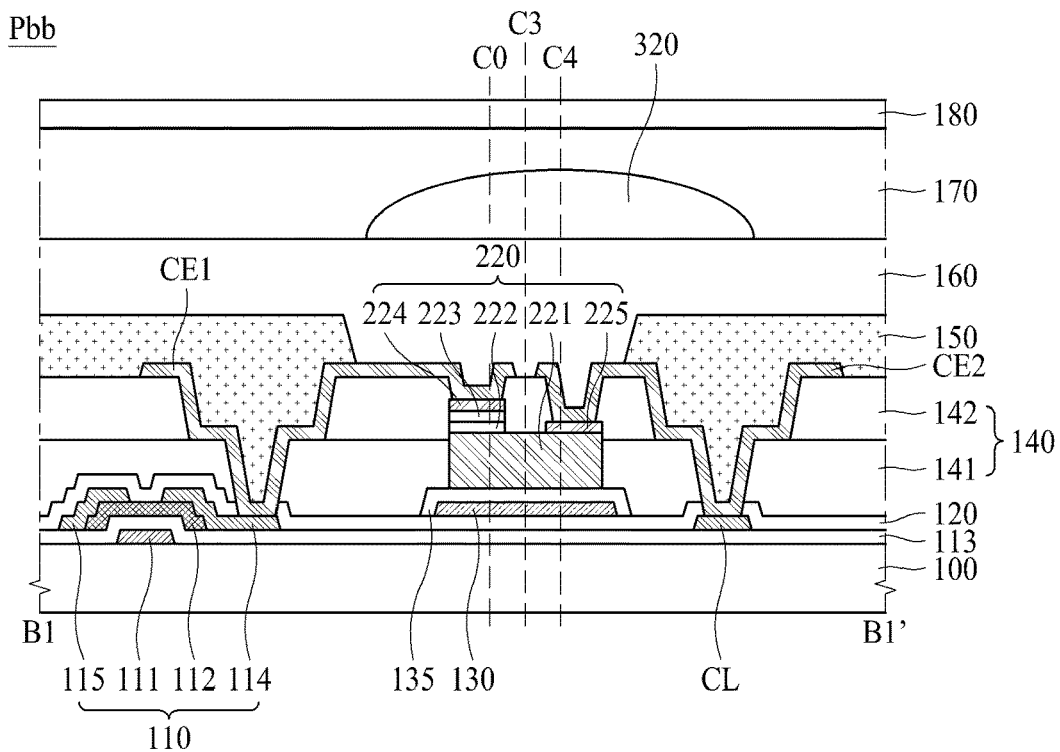

FIGS. 4A and 4B are cross sectional views of the display device according to one aspect of the present disclosure. FIG. 4A is a cross sectional view along A1-A1' of FIG. 3A, and FIG. 4B is a cross-sectional view along B1-B1' of FIG. 3B.

FIG. 4A shows any one subpixel Paa formed in the central area CA of the substrate 100. Referring to FIG. 4A, the display device according to one aspect of the present disclosure may include the substrate 100, a thin film transistor 110, an insulating interlayer 120, a reflective layer 130, a planarization layer 140, a bank 150, an encapsulation layer 160, a protective layer 170, a protective film 180, the first light emitting diode 210, and the first optical structure 310.

The substrate 100 may be formed of glass or plastic, but not limited thereto. The display device according to one aspect of the present disclosure may be configured by a top emission method in which light is emitted toward an upper portion. Therefore, an opaque material as well as a transparent material may be used as a material for the substrate 100.

The thin film transistor 110 may be formed on the substrate 100. The thin film transistor 110 may include a gate electrode 111, a semiconductor layer 112, a gate insulating layer 113, a source electrode 114, and a drain electrode 115.

The gate electrode 111 of the thin film transistor 110 may be formed on the substrate 100. Also, the semiconductor layer 112 may be formed on the gate electrode 111. The semiconductor layer 112 may include polysilicon or oxide semiconductor. When the semiconductor layer 112 includes the oxide semiconductor, the semiconductor layer 112 may include one of IGZO indium-gallium-zinc-oxide, IZO indium-zinc-oxide, IGTO indium-gallium-tin-oxide, and IGO indium-gallium-oxide.

The gate insulating layer 113 for insulating the gate electrode 111 and the semiconductor layer 112 from each other may be formed between the gate electrode 111 and the semiconductor layer 112. The gate insulating layer 113 may be formed in a single layer of silicon nitride SiNx or silicon oxide SiOx, or multiple layers thereof. In addition, FIG. 4A illustrates a bottom gate structure in which the semiconductor layer 112 is formed on the gate electrode 111, but not limited thereto. For example, it is possible to disclose a top gate structure in which the gate electrode 111 is formed on the semiconductor layer 112.

The source electrode 114 and the drain electrode 115 confronting each other may be formed on the semiconductor layer 112. Also, the insulating interlayer 120 may be formed on the source electrode 114 and the drain electrode 115. A contact hole exposing a portion of the source electrode 114 may be formed in the insulating interlayer 120. The insulating interlayer 120 may be formed of an organic insulating material such as acryl resin, epoxy resin, phenolic resin, polyamide resin, and polyimide resin.

A common line CL may be formed on the gate insulating layer 113. The common line CL may be a wiring for applying a common voltage to the first light emitting diode 210. Also, the common line CL may be formed of the same material as the source electrode 114 and the drain electrode 115, but not limited thereto. The insulating interlayer 120 may be formed on the common line CL. In addition, a contact hole exposing a portion of the common line CL may be formed in the insulating interlayer 120.

The reflective layer 130 may be formed on the insulating interlayer 120. The reflective layer 130 may reflect a portion of light emitted from the first light emitting diode 210 to the upper portion of the display device. More particularly, a portion of light emitted from the first light emitting diode 210 may be emitted toward the substrate 100 In addition, the reflective layer 130 may include a metal material having high reflectance.

An adhesive layer 135 may be formed on the reflective layer 130. The reflective layer 130 and the first light emitting diode 210 are insulated from each other by the adhesive layer 135, and the first light emitting diode 210 may adhered onto the reflective layer 130.

The first light emitting diode 210 is formed on the adhesive layer 135 and may be formed to overlap with the reflective layer 130. The first light emitting diode 210 may include a first semiconductor layer 211, an active layer 212, a second semiconductor layer 213, a first electrode 214, and a second electrode 215.

The first semiconductor layer 211 is formed on the adhesive layer 135 and is configured to provide holes to the active layer 212. The first semiconductor layer 211 may be made of a p-GaN-based semiconductor material such as GaN, AlGaN, InGaN, and AlInGaN. Also, impurities used for doping of the first semiconductor layer 211 may be Mg, Zn, Be, or the like.

The active layer 212 is formed on the first semiconductor layer 211 and may be a light emitting layer for emitting light. The active layer 212 may have a multi-quantum well MQW structure having a well layer and a barrier layer having a band gap higher than that of the well layer. For example, the active layer 212 may have a multi-quantum well structure of InGaN/GaN, but not limited thereto.

The second semiconductor layer 213 is formed on the active layer 212 and is configured to provide electrons to the active layer 212. The second semiconductor layer 213 may be made of an n-GaN-based semiconductor material such as GaN, AlGaN, InGaN, and AlInGaN. Also, impurities used for doping of the second semiconductor layer 213 may be Si, Ge, Se, Te, C, or the like.

As described above, the first light emitting diode 210 may be manufactured by sequentially stacking the first semiconductor layer 211, the active layer 212, and the second semiconductor layer 213, and etching a predetermined portion thereof to form the first electrode 214 and the second electrode 215. The etched portion is provided to space the first electrode 214 and the second electrode 215 apart from each other, and a predetermined portion may be etched to expose a portion of the first semiconductor layer 211. That is, the first electrode 214 and the second electrode 215 may be formed at different heights.

The first electrode 214 is formed on the second semiconductor layer 213 and may be electrically connected to the source electrode 114 of the thin film transistor 110 through a first connection electrode CE1. Also, the second electrode 215 is formed on the exposed first semiconductor layer 211 and is electrically connected to the common line CL through a second connection electrode CE2. Accordingly, different voltage levels applied to the source electrode 114 and the common line CL of the thin film transistor 110 are transmitted to the first and second electrodes 214 and 215 through the first and second connection electrodes CE1 and CE2, whereby the first light emitting diode 210 may emit light.

Each of the first and second electrodes 214 and 215 may include a metal material such as Au, W, Pt, Si, Ir, Ag, Cu, Ni, Ti, Cr, and an alloy thereof. Alternatively, each of the first and second electrodes 214 and 215 may include a transparent conductive material such as ITO Indium Tin Oxide and IZO Indium Zinc Oxide.

The planarization layer 140 is formed on the insulating interlayer 120 and includes first and second planarization layers 141 and 142. The first planarization layer 141 may planarize an upper portion of the thin film transistor 110 in other regions except the first light emitting diode 210 and the contact hole. The second planarization layer 142 is formed on the first planarization layer 141 and may be formed on the thin film transistor 110 and the first light emitting diode 210 in the region excluding the contact hole. At this time, the second planarization layer 142 may be formed to expose a portion of the first and second electrodes 214 and 215 of the first light emitting diode 210. FIG. 4A shows that the planarization layer 140 is formed as a double layer of the first and second planarization layers 141 and 142, but not limited thereto. That is, the planarization layer 140 may be formed as a single layer, or may be formed of three or more layers. The planarization layer 140 may be made of an inorganic insulating material or an organic insulating material. Alternatively, the planarization layer 140 may be formed by stacking a layer made of an organic insulating material and a layer made of an inorganic insulating material.

The first light emitting diode 210 may be stably fixed onto the substrate 100 through the planarization layer 140. Since the first and second connection electrodes CE1 and CE2 are formed on a gentle slope by the planarization layer 140, the first and second connection electrodes CE1 and CE2 and the first and second electrodes 214 and 215 of the first light emitting diode 210 may be stably connected.

The bank 150 is formed on the second planarization layer 142 to define a light emitting area. The bank 150 may be made of an inorganic insulating material or an organic insulating material. In addition, the bank 150 may be formed of the same material as the planarization layer 140, but not limited thereto. Also, the bank 150 may include a light-absorbing material.

The encapsulation layer 160 may be formed on the bank 150 and the first light emitting diode 210. The encapsulation layer 160 is formed to cover the entire surface of the substrate 100, to thereby planarize an upper portion of the first light emitting diode 210. The encapsulation layer 160 may include an inorganic insulating material such as a silicon oxide layer SiOx and a silicon nitride layer SiNx. Alternatively, the encapsulation layer 160 may include an organic insulating material such as acryl resin, epoxy resin, phenolic resin, polyamide resin, and polyimide resin.

The first optical structure 310 may be formed on the encapsulation layer 160. In FIG. 4A, an optical lens 310 is disclosed as one aspect of the first optical structure 310.

The optical lens 310 may be formed on an area overlapping with the active layer 212 of the first light emitting diode 210 on the encapsulation layer 160. The optical lens 310 may refract light incident at an angle different from a front surface of the display device so that the incident light faces the front surface of the display device. Accordingly, a path of the light may be changed so that the light directed toward the side surface of the display device faces the front direction of the display device.

As described above with reference to FIG. 3A, the center C0 of the subpixel Paa, the center C1 of the first light emitting diode 210, and the center C2 of the optical lens 310 may overlap with each other. That is, a distance from one end of the first light emitting diode 210 to one end of the optical lens 310 may be the same as a distance from the other end of the first light emitting diode 210 to the other end of the optical lens 310.

The protective layer 170 may be formed to cover the optical lens 310. The protective layer 170 may stably fix the optical lens 310 onto the encapsulation layer 160 and may prevent the optical lens 310 from being damaged by an external impact. Also, an upper surface of the protective layer 170 may be formed to be flat.

To minimize a loss of light passing through the protective layer 170, the protective layer 170 may comprise light-transmitting resin such as acryl resin, epoxy resin, phenolic resin, polyamide resin, and polyimide resin.

The protective film 180 is formed on the protective layer 170, thereby preventing an introduction of external light and minimizing a reduction of brightness.

FIG. 4B shows any one subpixel Pbb formed in the peripheral area SA of the substrate 100. Compared to FIG. 4A, FIG. 4B discloses substantially the same structure except for the structure of the second optical structure 320. Therefore, the same elements as those of the display device shown in FIG. 4A are denoted by the same reference numerals, and repeated descriptions thereof are omitted.

In the same manner as the first light emitting diode 210, the second light emitting diode 220 may include a first semiconductor layer 221, an active layer 222, a second semiconductor layer 223, a first electrode 224, and a second electrode 225.

The second optical structure 320 may be formed on the encapsulation layer 160. In the same manner as FIG. 4A, FIG. 4B discloses an optical lens 320 as one aspect of the second optical structure 320.

Similar as the optical lens 310 in FIG. 4A, the optical lens 320 may be formed on the encapsulation layer 160 in the region overlapping with the active layer 222 of the second light emitting diode 220. The optical lens 320 may refract light incident at an angle different from the front surface of the display device so that the incident light faces the front surface of the display device. Accordingly, a path of the light may be changed so that the light directed toward the side surface of the display device faces the front direction of the display device.

As described above with reference to FIG. 3B, the second light emitting diode 220 may be formed at the position where the center C3 of the second light emitting diode 220 and the center C0 of the subpixel Pbb formed in the peripheral area SA do not overlap with each other. Similarly, the optical lens 320 may be formed at the position where the center C4 of the optical lens 320 and the center C0 of the second subpixel Pbb do not overlap with each other. In addition, a distance from one end of the second light emitting diode 220 to one end of the optical lens 320 may be different from a distance from the other end of the second light emitting diode 220 to the other end of the optical lens 320.

Figure 5A:
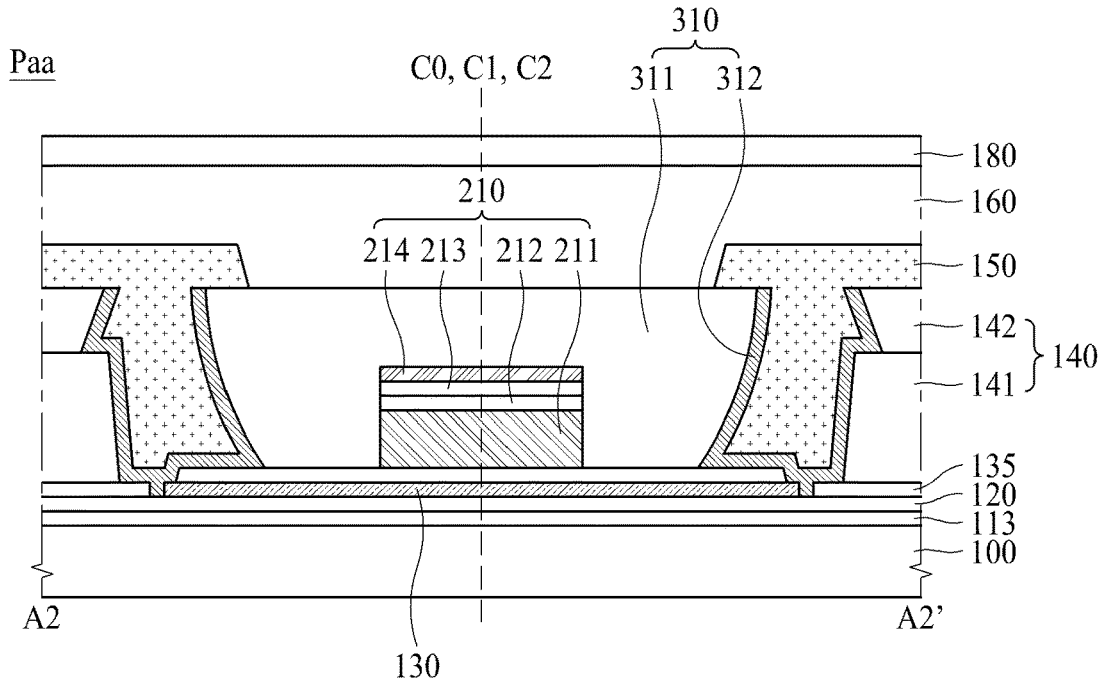
FIGS. 5A and 5B are cross-sectional views illustrating a display device according to another aspect of the present disclosure.
Figure 5B:
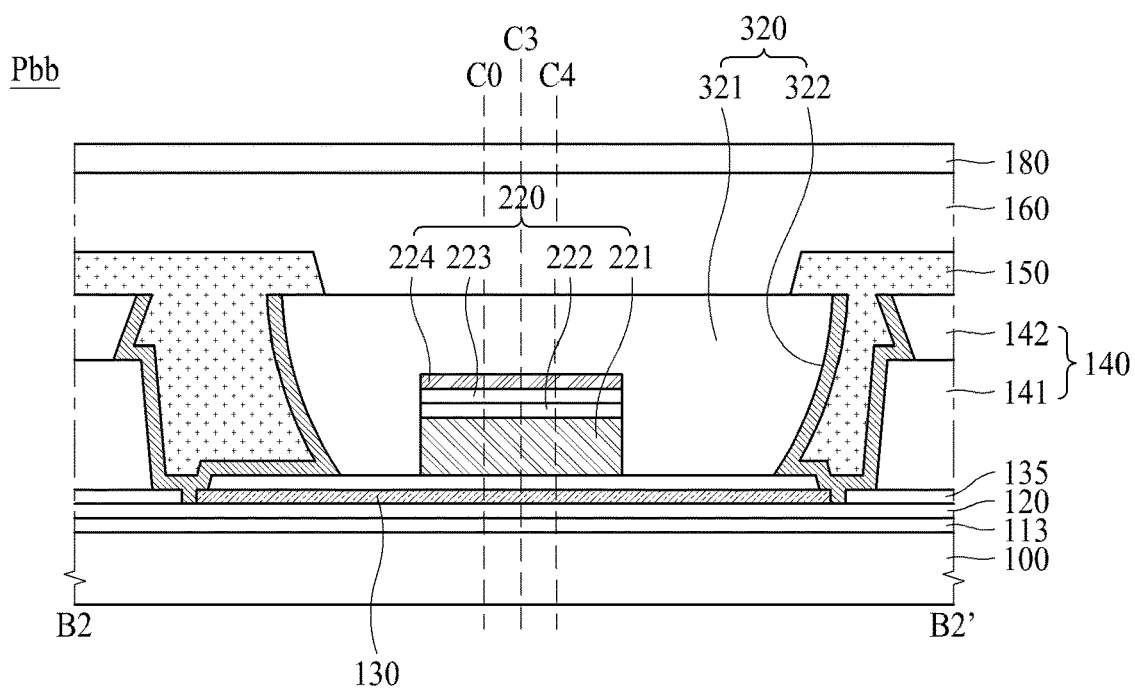

FIGS. 5A and 5B are cross-sectional views of a display device according to another aspect of the present disclosure. FIG. 5A is a cross-sectional view along A2-A2' of FIG. 3A, and FIG. 5B is a cross-sectional view along B2-B2' of FIG. 3B.

FIG. 5A shows any one subpixel Paa formed in a central area CA of a substrate 100. In FIG. 5A, a side reflective portion 310 is disclosed as another aspect of a first optical structure 310.

The side reflective portion 310 may include an insulating layer 311 and a side reflective plate 312.

An insulating layer 311 is formed on an adhesive layer 135 and is configured to surround a first light emitting diode 210. The insulating layer 311 may include a side surface having a slope and a flat upper surface. That is, an angle formed by the side surface of the insulating layer 311 and the substrate 100 may be an acute angle. Also, referring to FIG. 5A, the side surface of the insulating layer 311 may have a curvature, but not limited thereto. That is, the side surface of the insulating layer 311 may be formed to be flat. Also, the insulating layer 311 may be formed to be spaced apart from a planarization layer 140.

The insulating layer 311 may be made of an inorganic insulating material or an organic insulating material. Alternatively, the insulating layer 311 may be formed by stacking a layer made of an organic insulating material and a layer made of an inorganic insulating material. In addition, the insulating layer 311 may be formed of the same material as the planarization layer 140, but not limited thereto.

A side reflective plate 312 may be formed on the side surface of the insulating layer 311. That is, the side reflective plate 312 may be formed to extend along the side surface of the insulating layer 311 up to the same height as the upper surface of the insulating layer 311. Accordingly, among light emitted from the first light emitting diode 210, light directed toward the side surface of the first light emitting diode 210 may be reflected to the upper direction of the display device by the side reflective plate 312. Therefore, light efficiency of the display device may be improved. In addition, the side reflective plate 312 may cover the entire side surface of the insulating layer 311, but not limited thereto. That is, the side reflective plate 312 may expose a portion of the side surface of the insulating layer 311.

The side reflective plate 312 may be electrically connected to a reflective layer 130. In FIG. 5A, the side reflective plate 312 is in contact with both ends of the reflective layer 130, but not limited thereto.

As described above with reference to FIG. 3A, a center C0 of the subpixel Paa, a center C1 of the first light emitting diode 210, and a center C2 of the side reflective portion 310 may overlap with each other. That is, a distance from one end of the first light emitting diode 210 to the side reflective plate 312 disposed on one side may be the same as a distance from the other end of the first light emitting diode 210 to the side reflective plate 312 disposed on the other side.

A bank 150 may be formed to fill a space between the insulating layer 311 and the planarization layer 140. As described above, the bank 150 may be made of an inorganic insulating material or an organic insulating material. In addition, the bank 150 may be formed of the same material as the planarization layer 140, but not limited thereto. Also, the bank 150 may include a light-absorbing material.

An encapsulation layer 160 may be formed on the bank 150 and the side reflective portion 310. The encapsulation layer 160 is formed to cover the entire surface of the substrate 100, to thereby planarize an upper portion of the first light emitting diode 210. Also, a protective film 180 is formed on the encapsulation layer 160, thereby preventing an introduction of external light and minimizing a reduction of luminance.

FIG. 5B shows any one subpixel Pbb formed in a peripheral area SA of the substrate 100. Compared to FIG. 5A, FIG. 5B discloses substantially the same structure except for a structure of a second optical structure 320. Therefore, the same elements as those of the display device shown in FIG. 5A are denoted by the same reference numerals, and repeated descriptions thereof are omitted.

In the same manner as the first light emitting diode 210, a second light emitting diode 220 may include a first semiconductor layer 221, an active layer 222, a second semiconductor layer 223, a first electrode 224, and a second electrode 225.

A second optical structure 320 may be formed on the encapsulation layer 160. In the same manner as FIG. 5A, FIG. 5B discloses a side reflective portion 320 as one aspect of the second optical structure 320.

As described above with reference to FIG. 3B, the second light emitting diode 220 may be formed at the position where the center C3 of the second light emitting diode 220 and the center C0 of the subpixel Pbb formed in the peripheral area SA do not overlap with each other. Similarly, the side reflective portion 320 may be formed at the position where the center C4 of the side reflective portion 320 and the center C0 of the subpixel Pbb formed in the peripheral area SA do not overlap with each other. In addition, a distance from one end of the second light emitting diode 220 to the side reflective plate 322 disposed on one side may be the same as a distance from the other end of the second light emitting diode 220 to the side reflective plate 322 disposed on the other side.

According to the aspects of the present disclosure, the light efficiency of the display device may be improved by adjusting the arrangement relation between the light emitting diode and the optical structure.

It will be apparent to those skilled in the art that various substitutions, modifications, and variations are possible within the scope of the present disclosure without departing from the spirit and scope of the present disclosure. Therefore, the scope of the present disclosure is represented by the following claims, and all changes or modifications derived from the meaning, range and equivalent concept of the claims should be interpreted as being included in the scope of the present disclosure.

What is claimed is:

1. A display device comprising:
a substrate provided with a plurality of subpixels and including a central area and a peripheral area surrounding the central area;
a light emitting diode disposed in each of the plurality of subpixels on the substrate; and
an optical structure disposed on the light emitting diode,
wherein the plurality of subpixels includes a first subpixel disposed in the central area and a second subpixel disposed in the peripheral area,
the optical structure disposed in the first subpixel is disposed in a center of the first subpixel, and
the optical structure disposed in the second subpixel is disposed closer to one side of the second subpixel than another side of the second subpixel.

2. The display device according to claim 1, wherein the center of the first subpixel, a center of the light emitting diode arranged in the first subpixel, and a center of the optical structure arranged in the first subpixel overlap with each other.

3. The display device according to claim 1, wherein a center of the second subpixel and a center of the light emitting diode disposed in the second subpixel do not overlap with each other, and
the center of the second subpixel and a center of the optical structure disposed in the second subpixel do not overlap with each other.

4. The display device according to claim 1, wherein the optical structure includes an optical lens disposed over the light emitting diode.

5. The display device according to claim 4, wherein, in the first subpixel, a distance from one end of the light emitting diode disposed in the first subpixel to one end of the optical lens is the same as a distance from another end of the light emitting diode disposed in the first subpixel to another end of the optical lens.

6. The display device according to claim 4, wherein, in the second subpixel, a distance from one end of the light emitting diode formed in the second subpixel to one end of the optical lens is different from a distance from the other end of the light emitting diode formed in the second subpixel to the other end of the optical lens.

7. The display device according to claim 1, wherein the optical structure is a side reflective portion disposed on the light emitting diode, and
wherein the side reflective portion includes an insulating layer surrounding an upper portion and side portions of the light emitting diode and a side reflective plate disposed on a side surface of the insulating layer.

8. The display device according to claim 7, wherein, in the first subpixel, a distance from one end of the light emitting diode to the side reflective plate disposed at one side of the light emitting diode is the same as a distance from another end of the light emitting diode to the side reflective plate disposed at another side of the light emitting diode.

9. The display device according to claim 7, wherein, in the second subpixel, a distance from one end of the light emitting diode to the side reflective plate disposed at one side of the light emitting diode is different from a distance from another end of the light emitting diode to the side reflective plate disposed at another side of the light emitting diode.

10. The display device according to claim 1, wherein, in the peripheral area, the position where the optical structure is disposed in one subpixel is different from the position where the optical structure is disposed in another subpixel.

11. The display device according to claim 1, wherein, in each of the plurality of subpixels, the light emitting diode is disposed at a position which is spaced apart from a center of the subpixel by $\Delta X$ in a first direction, and is spaced apart from the center of the subpixel by $\Delta Y$ in a second direction perpendicular to the first direction, and values of $\Delta X$ and $\Delta Y$ are defined by a normal distribution.

12. The display device according to claim 11, wherein, in each of the plurality of subpixels, the optical structure is disposed at a position which is spaced apart from the center of the subpixel by 'dx' in the first direction and is spaced apart from the center of the subpixel by 'dy' in the second direction, and
values of the 'dx' and 'dy' are included in the following range, $$-\Delta X < dx < \Delta X, \quad -\Delta Y < dy < \Delta Y.$$

13. A display device comprising:
a substrate provided with a plurality of subpixels;
a light emitting diode disposed in each of the plurality of subpixels on the substrate; and
an optical structure disposed on the light emitting diode,
wherein, when a center of the light emitting diode overlaps with a center of the subpixel, a center of the optical structure overlaps with the center of the subpixel, and
when the center of the light emitting diode deviates from the center of the subpixel, the center of the optical structure is disposed to deviate from the center of the subpixel so that the optical structure overlaps with an entirety of the light emitting diode.

14. The display device according to claim 13, wherein the substrate includes a central area and a peripheral area surrounding the central area, and
wherein the center of the subpixel formed in the central area overlaps with the center of the corresponding light emitting diode, and the center of the subpixel formed in the peripheral area deviates from the center of the corresponding light emitting diode.

15. The display device according to claim 13, wherein the optical structure includes an optical lens or a side reflective portion.

* * * * *